United States Patent
Kluge et al.

(10) Patent No.: US 7,003,271 B2
(45) Date of Patent: Feb. 21, 2006

(54) DIRECT CONVERSION RECEIVER HAVING A GAIN-SETTING DEPENDENT FILTER PARAMETER

(75) Inventors: Wolfram Kluge, Dresden (DE); Lutz Dathe, Dresden (DE); Jörg Hönig, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 401 days.

(21) Appl. No.: 10/284,642

(22) Filed: Oct. 31, 2002

(65) Prior Publication Data

US 2003/0203727 A1 Oct. 30, 2003

(30) Foreign Application Priority Data

Apr. 30, 2002 (DE) ................................ 102 19 362

(51) Int. Cl.
*H04B 1/06* (2006.01)

(52) U.S. Cl. ................ 455/240.1; 455/323.1; 455/234.1; 375/344; 375/343; 375/350

(58) Field of Classification Search ............ 455/234.1, 455/232.1, 234.2–252.1, 334, 339, 136, 127.1, 455/324, 550.1, 575.1, 424, 425, 561, 138, 455/296, 180.1, 177.1, 188.1, 188.2, 192.1, 455/266, 275, 278.1, 281, 306, 307, 161.2, 455/164.2, 197.1, 265, 343, 323, 209, 214; 375/319, 295, 345, 230, 417, 346, 344, 343, 375/350; 329/340, 300, 318, 349–353, 304; 341/155, 156, 143, 139, 122; 330/129, 279, 330/254, 277, 278, 283, 302; 333/18, 28 R; 348/725, 726, 194; 381/15, 13; 327/553, 327/552, 558, 559, 561–563
See application file for complete search history.

(56) References Cited

U.S. PATENT DOCUMENTS 5,095,533 A  3/1992  Loper et al.
5,151,939 A  *  9/1992  Marrah et al. ................. 381/15

(Continued)

FOREIGN PATENT DOCUMENTS

DE  19933266  7/1999

(Continued)

OTHER PUBLICATIONS

"A Single-Chip 2.4-Ghz Direct-Conversion CMOS Receiver for Wireless Local Loop Using Multiphase Reduced Frequency Conversion Technique", Lee, et al, *IEEE Journal of Solid State Circuits*, ISSN: 0018-9200, vol. 36, May 2001, p. 800-809.

(Continued)

*Primary Examiner*—Edward F. Urban
*Assistant Examiner*—Charles Chow
(74) *Attorney, Agent, or Firm*—Meyertons Hood Kivlin Kowert & Goetzel, P.C.; B. Noël Kivlin (57) ABSTRACT

In a direct conversion radio frequency receiver, an automatic gain control is implemented that allows changing the operation mode of a filter unit in the baseband section of the receiver such that in a first operation mode filter capacities are selected to provide desired output signal characteristics, whereas in a second operation mode the filter settling time is significantly reduced in order to speed up gain adaptation and to improve gain loop stability. In one embodiment the cut-off frequency of a high pass filter and the Q-factor of a subsequent low pass filter are increased and decreased respectively upon changing the gain setting of a variable gain amplifier to accelerate settling of the filter.

34 Claims, 2 Drawing Sheets

U.S. PATENT DOCUMENTS

| | | | |
|---|---|---|---|
| 5,257,286 A * | 10/1993 | Ray | 375/230 |
| 6,006,079 A | 12/1999 | Jaffee et al. | |
| 6,335,656 B1 | 1/2002 | Goldfarb et al. | |
| 6,356,746 B1 * | 3/2002 | Katayama | 455/324 |
| 6,512,472 B1 * | 1/2003 | Smith et al. | 341/155 |
| 2003/0125000 A1 * | 7/2003 | Gharpurey et al. | 455/234.1 |

FOREIGN PATENT DOCUMENTS

| | | |
|---|---|---|
| DE | 10131676 A1 | 6/2001 |
| EP | 0722627 | 2/1996 |
| EP | 1083668 | 3/2001 |
| EP | 1102413 | 5/2001 |
| EP | 1113577 | 7/2001 |
| WO | 00/72441 | 11/2000 |
| WO | 01/37436 | 5/2001 |
| WO | 01/47105 | 6/2002 |

OTHER PUBLICATIONS

"Future Directions in Silicon ICs for RF Personal Communications", Gray, et al, *Custom Integrated Circuits Conference, 1995, Proceedings of the IEEE*, May 4, 1995, Santa Clara, CA, p. 83-90.

Translation of Official Communication for German Patent Application No.: 102 19 362.2-35, Mailed Aug. 30, 2005.

\* cited by examiner

DIRECT CONVERSION RECEIVER HAVING A GAIN-SETTING DEPENDENT FILTER PARAMETER

FIELD OF THE PRESENT INVENTION

The present invention generally relates to radio frequency (RF) receivers having a direct conversion architecture, wherein an automatic gain control is performed so as to rapidly adapt a variable gain amplifier to the received RF signal level.

DESCRIPTION OF THE RELATED ART

In radio receivers, the so-called direct conversion architecture is increasingly used, as in these devices down-conversion of the radio frequency signal into the baseband signal in a single step without the creation of an intermediate frequency signal is accomplished, thereby allowing the elimination of bulky, high-quality intermediate frequency filters. Moreover, since amplification and filtering mainly takes place in the baseband section, current-consuming high frequency amplifiers, necessary for signal amplification at intermediate frequencies, may be replaced by amplifiers and filters operating at baseband. The aspect of reduced power consumption is especially important in applications such as mobile phones, portable computers, and the like. Moreover, due to the lack of bulky, high-quality LC filters, which may not be easily integrated into a semiconductor substrate in the foreseeable future, the baseband components of a direct conversion device may directly be formed on a silicon chip, thereby significantly reducing device volume.

Except for the advantages mentioned so far, the direct conversion architecture also involves serious drawbacks compared to the superheterodyne architecture. Due to the nature of the direct conversion of the radio frequency signal into the baseband signal, low frequency signals and DC components may be part of the down-converted signal spectrum, and thus spurious DC components may not be removed from the signal spectrum. Moreover, any slight mismatch of the local oscillator to the frequency and phase of the incoming RF signal leads to a DC offset that may possibly not be distinguished from low frequency data components. Thus, a careful circuit design is mandatory to avoid or at least minimize DC offset components in the baseband signal.

A further issue in RF receivers is the adaptation of the degree of signal amplification to the received radio frequency signal strength. This problem gains of particular importance in applications, such as wireless local area network (WLAN) and mobile phone applications in which data packets may be preceded by a short signal preamble. Thus, it is highly desirable that the gain setting is performed within the signal preamble to avoid losing any data or to prevent repeating the respective data packet.

To this end, usually a so-called automatic gain control is performed in which the down-converted baseband signal is rectified to create a signal indicating the amplitude of the baseband signal. In a digital automatic gain control operation, the rectified signal is then converted into a digital number indicating the obtained signal strength and a corresponding gain control signal is generated that is supplied to the variable gain amplifiers to newly adjust the gain setting in response to the measured baseband signal. In order to accurately determine the new gain setting of the variable gain amplifiers, the duration of the measuring, i.e., rectifying the baseband signal, has to be selected so as to ensure that the rectified signal represents the baseband signal amplitude within a predefined tolerance range.

After obtaining the rectified signal having the required accuracy and establishing a corresponding gain control signal, the variable gain amplifiers are switched to the respective new gain settings, which, however, generally leads to DC offset steps at the amplifier outputs. Thus, any change in the discrete gain settings of the involved baseband amplifiers will lead to DC offset steps of the baseband signal to be measured and for large gain steps, exceeding, for example, ten dB, the DC offset created at the baseband output may be remarkably larger than the amplitude of the desired signal. A subsequent measurement of the baseband signal could therefore produce a measurement result and thus a gain control signal that is based on the DC offset created by the gain switching rather than by the received RF signal. As a consequence, the additional DC offset may result in an unstable automatic gain control loop.

To avoid the introduction of additional DC offsets due to gain switching, in many known devices the variable gain amplifiers are coupled by high pass filters having a relatively low cut-off frequency to reduce undesired DC offset components. Although the provision of such high pass filters may significantly improve the automatic gain controlling, a DC offset created by gain switching at the amplifier output entails nevertheless a step response of the high pass filter, which, in turn, requires—due to the very low cut-off frequency—a relatively long settling time, so that an accurate measurement of the baseband signal necessitates a long measurement period, thereby preventing the automatic gain control from rapidly responding to a fast RF signal variation, which especially occurs upon receiving of an RF signal burst indicating the imminent transmission of data. A long settling time of the automatic gain control may therefore lead to the loss of data or may require the repeating of the respective data packet.

In view of the above problems, it would therefore be highly desirable to have a direct conversion receiver including an automatic gain control that allows a rapid adaptation of the amplifier gain without instability of the gain loop.

SUMMARY OF THE INVENTION

Generally, various embodiments are directed to direct conversion receiver devices and methods for operating the same, wherein a digital automatic gain control is performed to select one of a plurality of discrete gain settings of a variable gain amplifier in response to the measured baseband signal. The direct conversion receiver includes a filter unit adapted to operate in a first operation mode in which the filter unit exhibits the filter characteristics required to provide an appropriate baseband signal for a relatively stable RF signal input to the receiver. In a second operation mode of the filter unit the filter characteristics are modified such that a filter settling time is significantly shorter than in the first operation mode so that the filter unit allows a rapid adaptation to any DC step provided to the filter unit from a preceding amplifier stage.

Changing the operation mode of the filter unit may be accomplished by changing the value of at least one filter parameter. In this way, gain adaptation to the received RF signal is significantly accelerated while maintaining loop stability.

In one embodiment, an automatic gain controller for digitally controlling gain of a baseband signal comprises a baseband input section configured to receive the baseband signal and to provide a sample signal indicative of the baseband signal amplitude. Furthermore, a gain control section is provided and configured to produce a gain setting signal in response to the sample signal. The automatic gain controller further comprises a filter parameter section that is configured to produce a filter parameter signal for changing a filter parameter when the gain setting signal indicates a change of a currently valid gain setting.

In a further illustrative embodiment, a direct conversion receiver comprises a baseband section including at least one variable gain amplifier, and a filter unit coupled with its input to an output of the variable gain amplifier and configured to reduce DC offset and to select a desired signal channel, wherein the filter unit is operable in a first operation mode and a second operation mode by changing at least one filter parameter. The direct conversion receiver further comprises an automatic gain controller configured to select a gain setting on the basis of a signal output by the baseband section and to switch the filter unit from the first operation mode into the second operation mode upon changing a gain setting of said variable gain amplifier.

In a further embodiment, a method of automatically controlling gain of a baseband signal in a direct conversion receiver comprises obtaining a sample signal from the baseband signal, wherein the sample signal is indicative of a signal amplitude of the baseband signal. Moreover, a gain setting signal is obtained on the basis of the sample signal to select one of a plurality of discrete gain settings. Additionally, a filter parameter signal is provided in correlation to the gain setting signal, wherein the filter parameter signal causes a change of a value of at least one filter parameter when the gain setting signal indicates a change of the currently valid gain setting.

In a further illustrative embodiment a method of automatically controlling gain of a baseband signal in a direct conversion receiver comprises obtaining a sample signal from said baseband signal, wherein the sample signal is indicative of a signal amplitude of the baseband signal. Moreover a gain setting signal is generated on the basis of the sample signal to select one of a plurality of discrete gain settings of the direct conversion receiver. Additionally, a filter parameter signal is generated in correlation with the gain setting signal, wherein the filter setting signal causes a change of at least one filter parameter value when the gain setting signal indicates a change of the currently valid gain setting.

BRIEF DESCRIPTION OF THE DRAWINGS

Further advantages, objects, and embodiments of the present invention are defined in the appended claims and will become more apparent with the following detailed description when taken with reference to the accompanying drawings, in which:

DETAILED DESCRIPTION OF THE PRESENT INVENTION

It is to be noted that although the present invention is described with reference to the embodiments as illustrated in the following detailed description and in the accompanying drawings, the detailed description as well as the drawings are not intended to limit the present invention to the particular embodiments disclosed therein, but rather the described embodiments merely exemplify the various aspects of the present invention, the scope of which is defined by the appended claims.

Figure 1A:
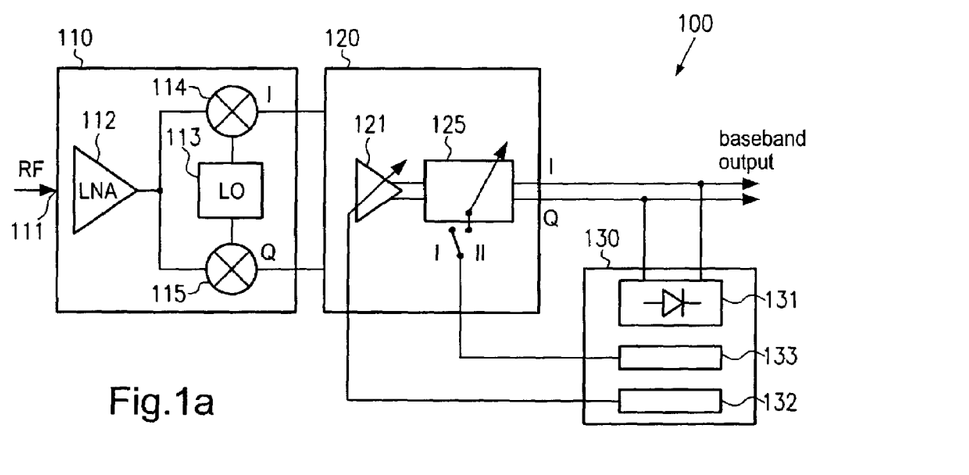
FIG. 1a shows a schematic block diagram of one illustrative embodiment of the present invention.
Figure 1B:
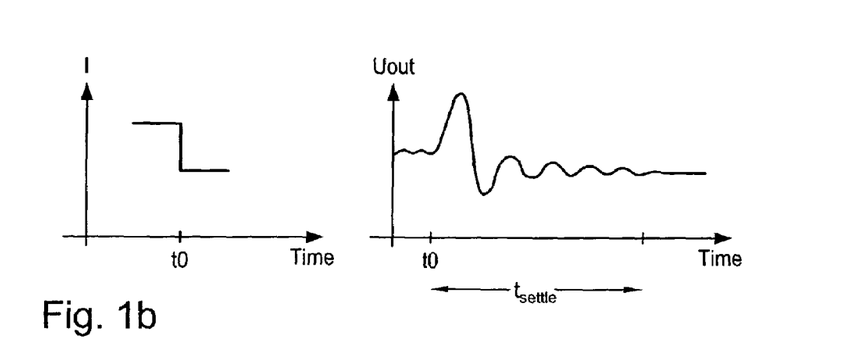
FIG. 1b shows a graph presenting the step response of a filter unit in a first operation mode.
Figure 1C:
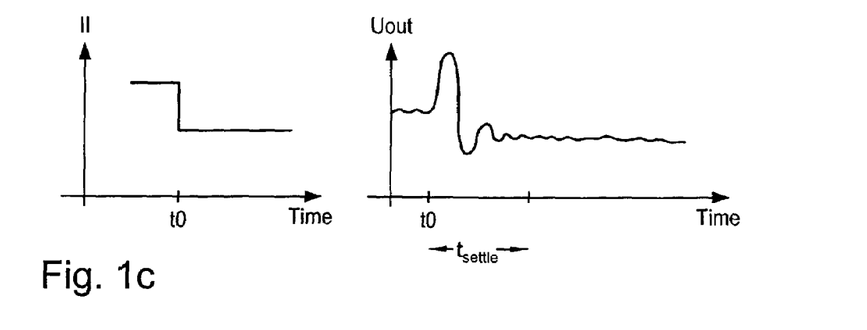
FIG. 1c shows a graph representing the step response of the filter unit in a second operation mode.

With reference to FIGS. 1a–1c, one illustrative embodiment will now be described that is directed to a baseband signal path usable in a direct conversion receiver, wherein digital automatic gain controlling is performed such that upon changing the discrete gain setting of a variable gain amplifier at least one parameter of a filter unit is changed to switch the filter unit from a first operation mode into a second operation mode that allows the filter unit to rapidly settle in response to a DC step input.

In FIG. 1a a direct conversion receiver 100 includes an RF section 110 including an RF input 111, a low noise amplifier (LNA) 112, a local oscillator (LO) 113 and mixers 114 and 115. The receiver 100 further comprises a baseband section 120 including a variable gain amplifier (VGA) 121 and a switchable filter unit 125, wherein the filter unit 125 is switchable between at least two operation modes indicated as I and II in the drawing.

The receiver 100 further comprises an automatic gain controller 130 including a rectifying section 131, a gain controlling section 132 and a filter control section 133.

In operation, an RF signal may be supplied at the RF input 111 and may be fed in the low noise amplifier 112. The low noise amplifier 112 provides the moderately amplified RF signal to the mixers 114 and 115, which also receive signals from the local oscillator 113, wherein the mixer 114 receives a local oscillator signal that is synchronized in frequency and phase with the RF signal, whereas the mixer 115 receives a local oscillator signal that is 90° out of phase with respect to the local oscillator signal supplied to the mixer 114. The mixer 114 outputs a baseband signal that is also referred to as in-phase signal, whereas the mixer 115 outputs a phase shifted baseband signal that is commonly referred to as quadrature signal. The baseband signals are then supplied to the baseband section 120 and are amplified by the variable gain amplifier 121. It should be noted that, for the sake of simplicity, a single amplifier symbol is depicted in FIG. 1a, whereas the variable gain amplifier 121 may comprise a plurality of amplifier stages for each of the baseband signal branches.

The amplified baseband signal is then entered into the filter unit 125, which is operated in a first operation mode, indicated as I, in which the parameter setting is such that the filter unit 125 allows adjustment to the desired radio channel and also allows minimization of a DC offset generated by, for example, the variable gain amplifier 121. Typically, minimizing DC offsets is accomplished by providing AC coupling at the output of the amplifier 121, such as a filter portion acting as a high pass filter, wherein, however, a cut-off frequency of the AC coupling has to be very low so as to not unduly affect the data signal spectrum. Consequently, the filter response to any fast signal variation will result in a relatively long settling time of the filter unit 125, as will be described with reference to FIG. 1b.

Moreover, the filter unit 125 comprises a filter portion for selecting a desired radio channel within the baseband signal range and filter parameters in the first operation mode are selected so as to impart to the filter unit 125 the required filter properties to output the desired frequency range of the baseband signals. The baseband output signals are also supplied to the automatic gain controller 130, wherein in the rectifying section 131 the baseband output signals are rectified to obtain a sample signal indicative of the amplitude of the baseband output signals. The sample signal may then be digitized, preferably in the rectifying section 131, and may then be supplied to the filter control section 133 and the gain control section 132. From the digitized sample signal, the gain control section 132 estimates whether or not the baseband output signal is within a predefined desired range. When the baseband output signal is assessed to be within the specified range, the gain setting signal supplied to the variable gain amplifier 121 does not cause the presently valid discrete gain setting to be changed. In this case, a filter control signal output by the filter control section 133 to the filter unit 125 maintains the presently valid parameter setting and thus keeps the filter unit 125 in the first operation mode.

Next, the situation should be considered in which the receiver 100 is "waiting" for an RF signal indicating the beginning of a data transmission. In this situation, usually the automatic gain controller 131 is activated and sets the variable gain amplifier 121 to the highest gain step to achieve maximum sensitivity of the receiver 100. If an RF burst is received at the RF input 111, the signal is processed as described above and a relatively strong baseband output signal is supplied to the rectifying section 131 of the automatic gain controller 130. Generally, digitizing the baseband output signal to obtain the sample signal requires a certain time interval to obtain a relatively accurate rectified signal that correctly represents the baseband output signal amplitude. After this measurement period, the gain control section 132 assesses the signal amplitude of the sample signal and determines a new gain setting of the variable gain amplifier 121 to reduce the amplitude of the baseband output signal. In the present case, when an RF burst is detected at a high or maximum gain setting of the variable gain amplifier 121, a large gain reduction is required, for example a gain reduction of 10 dB or more, so that consequently the variable gain amplifier 121 will produce a relatively large DC offset step when adjusted to the new gain setting. In a conventional receiver device without a filter control section 133 that operates in correlation with the gain control section 132, the filter unit 125 would remain in the first operation mode with an unchanged parameter setting and filter settling would take a relatively long time interval due to the filter properties required for the steady state operation of the baseband section 120.

In FIG. 1b, the left-hand graph shows a typical DC offset step that is input into the filter unit 125, wherein the gain setting of the variable gain filter 121 is changed upon application of the gain setting signal of the gain control section 132 at time t0. In the right-hand graph, a corresponding output voltage of the filter unit 125 is shown for the first operation mode, wherein the settling time $t_{settle}$ is relatively long so that large signal variations may occur during the settling time. For a stable operation of the automatic gain control loop, it is thus necessary in the conventional device to delay the next measurement for producing the sample signal to a time point after the filter unit 125 has settled, thereby significantly slowing the response of the automatic gain controller 130 to any RF signal amplitude variation.

In the embodiment depicted in FIG. 1a, the filter control section 133 is provided and switches in correlation with the gain control section 132 the filter unit 125 into the second operation mode by appropriately adjusting at least one filter parameter that has an influence on the settling time of the filter unit 125.

FIG. 1c shows a corresponding filter response when a required gain reduction produces the DC offset step at the input of the filter unit 125. Again, in the left-hand graph the DC offset step output by the variable gain amplifier 121 upon gain reduction is shown, whereas the right-hand graph shows the corresponding filter response, wherein, however, at least one filter parameter is changed so that the filter unit 125 is in the second operation mode. The corresponding settling time is thus significantly reduced.

In one embodiment, the filter control section 133 is adapted to switch the filter unit 125 into the first operation mode after expiration of a certain time interval that is equal or larger than the settling time of the filter unit 125 in the second operation mode. For example, the operation of the rectifying section 131 and/or digitizing of the rectified signal and the operation of the filter control section 133 and of the gain control section 132 may be performed in synchronism with a clock signal, wherein, for instance during the high level of the clock signal, the baseband output signal is measured and rectified, whereas updating of the gain setting of the variable gain amplifier 121 and switching of the filter unit 125 may be carried out during the falling edge of the clock signal and filter settling of the filter unit 125 during the second operation mode takes place during the low level phase of the clock signal. Any other appropriate timing for measuring, gain setting and filter switching and filter settling in correlation therewith is, of course, also within the scope of the present invention.

In a further embodiment, the filter control section 133 is configured to switch the filter unit 125 into the second operation mode once the gain control section 132 indicates that a plurality of subsequent gain settings are to be expected. A corresponding situation frequently occurs in the above-described case, when the receiver 100 is waiting for an RF burst and control of the dynamic range of the variable gain amplifier 121 may not be performed in a single gain reduction step. Accordingly, the filter unit 125 remains in the second operation mode during the plurality of gain reductions and is switched back to the first operation mode when the gain control section 132 indicates the end of gain adaptation to an RF burst. Since the filter unit 125 remains in the second operation mode, slight signal variations that may be caused by the switching from the first to the second operation mode are substantially eliminated and an accurate fast gain settling during reception of an RF burst can be obtained. In situations where the receiver 100 receives slowly varying RF input signals, the filter unit 125 may be operated as previously described, i.e., the filter unit 125 may be switched from the first operation mode to the second operation mode when the gain setting of the variable gain amplifier 121 is changed and subsequently the filter unit 125 is switched back to the first operation mode.

In another illustrative embodiment, the filter unit 125 may be maintained in the first operation mode, since the filter response to small DC offset steps may be within a tolerable range so that a measurement of the baseband output signal during an advanced phase of the settling time interval in the first operation mode does not lead to an instability of the gain control loop. A corresponding arrangement may be advantageous when a potential signal distortion caused by a filter switching is of comparable magnitude as a signal variation during filter settling in response to a small DC offset step. For example, when the variable gain amplifier 121 has a plurality of discrete gain settings with a gain step of, for instance, 3 dB, filter switching may not be performed when the gain setting is changed by a predefined number of gain steps, for example by 3 dB, whereas the filter unit 125 is switched into the second operation mode when the gain control section 132 indicates that a gain reduction or increase of 6 dB or more is required, since then larger DC offset steps may occur.

Figure 2:
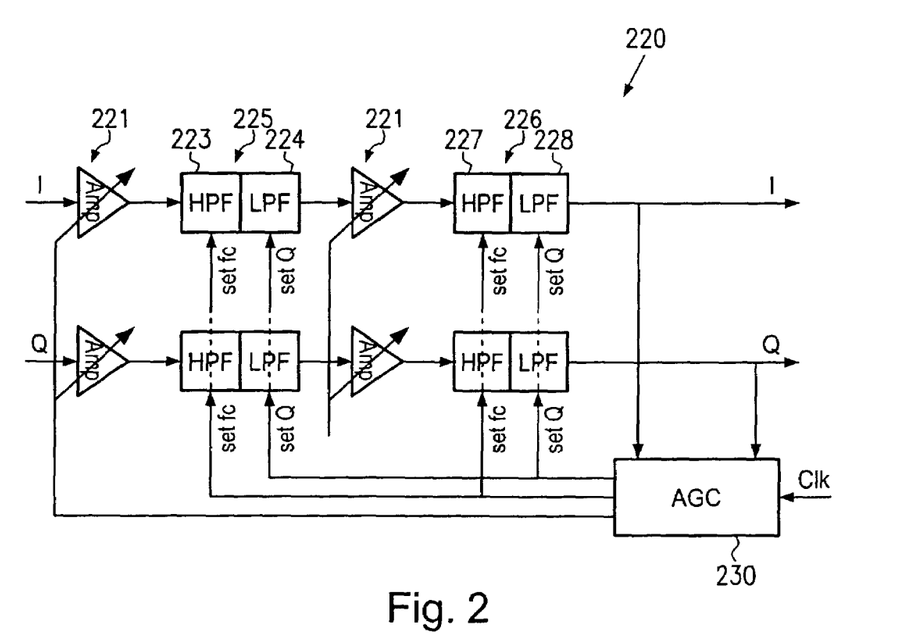
FIG. 2 shows a block diagram of a further illustrative embodiment, in which filter parameters of high pass filters and low pass filters are controlled by an automatic gain controller.

With reference to FIG. 2, a further illustrative embodiment will now be described. In FIG. 2 a baseband section 220 comprises a first variable gain amplifier stage 221 and a second variable gain amplifier stage 222. A first filter unit 225 is connected between an output of the first amplifier stage 221 and an input of the second amplifier stage 222. A second filter unit 226 is connected to the output of the second amplifier stage 222. The first filter unit 225 includes a high pass filter section 223 followed by a low-pass filter section 224 and the second filter unit 226 also includes a high pass filter section 227 followed by a low pass filter section 228. For convenience, only the components in the in-phase signal path are denoted, but it is to be understood that the following description also refers to the corresponding components in the quadrature signal path. Moreover, an automatic gain controller 223 is provided that is operatively connected to the first and second amplifier stages 221, 222, and the first and second filter units 225 and 226. Furthermore, the automatic gain controller 230 is adapted to receive a clock signal in synchronism with which the automatic gain controller 230 is operated. The automatic gain controller 230 may include components similar to those described with reference to FIG. 1*a*, so that a corresponding description of these components is omitted.

The high pass filter sections 223 and 227 are configured such that their respective cut-off frequencies may be changed between a first low cut-off frequency value and a second higher cut-off frequency value. Thereby, the first cut-off frequencies of the high pass filter sections 223 and 227 may be substantially equal or may differ from each other, depending on circuit design requirements. The same holds true for the second cut-off frequencies of the high pass filter sections 223 and 227. The low pass filter sections 224 and 228 are configured such that the respective Q-factors may be switched from a first high Q-factor to a second low Q-factor. As with the high pass filter sections, the low pass filter sections 224 and 228 may have substantially equal first Q-factors and substantially equal second Q-factors, or the respective first and second Q-factors may differ from each other in correspondence with circuit design requirements.

In operation, a baseband signal is supplied to the first amplifier stage 221 and is output to the first filter unit 225, wherein the high pass filter section 223 is switched to the first cut-off frequency and the low pass filter section 224 is switched to the first Q-factor, so that the high pass filter section 223 effectively minimizes any amplifier induced DC components and the low pass filter section 224 provides for radio channel selection. The correspondingly amplified and filtered signal is supplied to the second amplifier stage 222 and is subsequently filtered in the second filter unit 226, wherein the high pass filter section 227 and the low pass filter section 228 are set to the first cut-off frequency and the first Q-factor, respectively. This parameter setting defines a first operation mode of the first and second filter units 225, 226. The correspondingly processed baseband signal is then supplied to the automatic gain controller 230, which generates a corresponding gain setting signal to select one of several discrete gain settings in the first and second amplifier stages 221, 222. It should be noted that the number of gain settings of the first and second amplifier stages 221, 222 may not be identical and may be appropriately selected so as to obtain a desired overall dynamic range of the baseband section 220. If the automatic gain controller 230 assesses the baseband output signal as not falling within a predefined range, a corresponding gain setting signal is created to switch the first amplifier stage 221 and/or the second amplifier stage 222 so as to obtain the required overall amplification. If the gain setting of the first amplifier stage 221 is to be changed, the automatic gain controller 230 provides, in correlation with the gain setting signal, a parameter setting signal to the first filter unit 225 so as to select the second cutoff frequency of the high pass filter section 223 and the second Q-factor of the low pass filter section 224.

Due to the second operation mode of the first filter unit 225 caused by the parameter change, the time interval for settling of the first filter unit 225 in response to a DC offset step caused by gain step of the first amplifier stage 221 is significantly reduced in a similar fashion as described with reference to FIG. 1*c*. If the automatic gain controller 232 assesses that the second amplifier stage 222 is to be switched to a different gain setting, the second filter unit 226 is switched to the second operation mode by the automatic gain controller 230. The same holds true if a change of the gain setting of both the first and the second amplifier stages 221 and 222 is required. Regarding various operation situations of the baseband section 220 and the automatic gain controller 230, it is referred to the embodiments described with reference to FIGS. 1*a–*1*c*.

In one particular embodiment, the first and/or second filter units 225, 226 include active RC circuits so that the variation of filter parameters, such as the cut-off frequency and the Q-factor, can readily be achieved by changing respective resistor values in the active RC circuits. Preferably, changing the resistor value may be accomplished by switching field effect transistors, such as MOS transistors. By changing, i.e. switching, resistor values in the first and second filter units 225, 226, the corresponding parameter values may be changed without substantially generating a signal response at the output so that signal distortion of the baseband signal to be filtered is substantially avoided.

Other embodiments may be adapted such that additionally the capacitance within the first and/or second filter units 225, 226 may be changed. For example, unit capacitors may selectively be activated or deactivated by corresponding transistor elements. In these embodiments, an operation mode may be preferable in which subsequent filter switching is avoided and the first and/or second filter units 225, 226 are transferred into the second operation mode only when a rapid signal variation occurs, as is the case when the receiver is waiting an RF burst. Thus, the filter units 225, 226 may be set to the second operation mode during subsequent gain reduction steps required in a fast gain settling period and the filter units 225, 226 may remain in the first operation mode when merely slowly varying RF signals are received. In this way, any signal distortion upon switching a capacitor for the fast gain settling period, where a possible data loss may not be critical as the fast gain settling is generally necessary only during the preamble of a data packet.

Moreover, in one embodiment parameter change of the first and/or second filter units 225, 226 may be achieved by capacitor switching, and possibly by resistor switching as well, in situations when large gain reductions are required, whereas in situations with moderately varying RF signals, the filter units may be switched into the second operation mode by merely switching resistors so as to minimize signal distortion by filter switching. In this embodiment, the second operation mode defined by capacitor switching and resistor switching may have a significantly higher cut-off frequency and a significantly reduced Q-factor compared to the second operation, which is defined only by resistor switching.

It should be noted that the specific filter design for the high pass filter section 223, 227 and the low pass filter sections 224 and 228 is not restricted to any specified architecture, and any appropriate filter design known in the art may be selected.

Furthermore, in some applications it may be sufficient to change the cut-off frequency without changing the Q-factor.

Further modifications and variations of the present invention will be apparent to those skilled in the art in view of this description. Accordingly, the description is to be construed as illustrative only and is for the purpose of teaching those skilled in the art the general manner of carrying out the present invention.

The invention claimed is:

1. An automatic gain controller for digitally controlling gain of a baseband signal comprising:
    a baseband signal input section configured to receive the baseband signal and to provide a sample signal indicative of the baseband signal amplitude;
    a gain control section configured to produce a gain setting signal in response to said sample signal; and
    a filter parameter section configured to produce a filter parameter signal for changing a filter parameter when said gain setting signal indicates a change of a currently valid gain setting, wherein said sample signal, said gain setting signal, and said filter parameter signal are generated in correlation with a clock signal supplied to the automatic gain controller, and wherein the filter parameter section is configured to provide said filter parameter signal when the gain setting signal indicates a change of the gain setting that exceeds a predefined limit, and wherein said filter parameter is maintained when said gain setting signal indicates a change of the gain setting that does not exceed a predefined limit.

2. The automatic gain controller of claim 1, wherein said filter parameter section is further configured to produce a second filter parameter signal to reestablish a filter parameter value used prior to the provision of said filter parameter signal.

3. The automatic gain controller of claim 1, wherein said filter parameter is a cut-off frequency of a high-pass filter.

4. The automatic gain controller of claim 1, wherein said filter parameter is a Q-factor of a low-pass filter.

5. A direct conversion receiver comprising:
    a baseband section including
        at least one variable gain amplifier,
        a filter unit coupled with its input to an output of the variable gain amplifier and configured to reduce DC offset and to select a desired signal channel, the filter unit being operable in a first operation mode and a second operation mode by changing at least one filter parameter, wherein said filter unit is configured such that a settling time of the filter unit in the second operation mode is less than a settling time in the first operation mode upon application of a step signal and wherein the settling time in the second operation mode is less than a predefined time interval; and
        an automatic gain controller configured to select a gain setting on the basis of a signal output by the baseband section and to switch the filter unit from the first operation mode into the second operation mode upon changing a gain setting of said variable gain amplifier wherein the automatic gain controller is configured to receive a clock signal, whereby said predefined time interval is equal or less than a half period of said clock signal.

6. The direct conversion receiver of claim 5, wherein said filter unit comprises a high pass filter coupled to the output of the variable gain amplifier to reduce DC offset.

7. The direct conversion receiver of claim 6, wherein said high pass filter is adapted to be switchable between a first operation mode with a first cut-off frequency and at least one second operation mode with at least one second cut-off frequency, the at least one second cut-off frequency being higher than the first cut-off frequency.

8. The direct conversion receiver of claim 6, wherein said filter unit comprises a low pass filter coupled to the output of said high pass filter to select the desired frequency range.

9. The direct conversion receiver of claim 8, wherein said low pass filter is switchable between a first operation mode with a first Q-factor and at least one second operation mode with at least one second Q-factor, the at least one second Q-factor being less than the first Q-factor.

10. The direct conversion receiver of claim 5, wherein said filter unit comprises an active RC circuit, wherein at least one resistor value is switchable so as to transfer the filter unit from the first operation mode into the second operation mode.

11. The direct conversion receiver of claim 10, wherein at least one capacitor is provided that is switchable such that said filter unit is transferred from the first operation mode into the second operation mode.

12. The direct conversion receiver of claim 5, wherein said automatic gain controller is configured to provide a filter setting signal for switching the filter unit from the first operation mode into the second operation mode, and a gain setting signal for selecting a gain setting of the variable gain amplifier in synchronism with said clock signal.

13. The direct conversion receiver of claim 12, wherein the automatic gain controller further comprises a signal processing section for receiving a baseband output signal and providing a sample signal indicative of a signal amplitude of said baseband output signal, a gain control section for generating said gain setting signal in response to the sample signal, and a filter setting section for providing said filter setting signal in response to the sample signal.

14. A method of automatically controlling gain of a baseband signal in a direct conversion receiver, the method comprising:
    obtaining a sample signal from said baseband signal, the sample signal being indicative of a signal amplitude of the baseband signal;
    generating a gain setting signal on the basis of said sample signal to select one of a plurality of discrete gain settings of the direct conversion receiver; and
    generating a first filter parameter signal in correlation with said gain setting signal, the filter setting signal causing a change of at least one filter parameter value when said gain setting signal indicates a change of the currently valid gain setting; and
    generating a second filter parameter signal to re-establish said at least one filter parameter value when said gain setting signal indicates no change of the currently valid gain setting.

15. The method of claim 14, further comprising generating the second filter parameter signal to re-establish said at least one filter parameter value after expiring of a predefined time interval after said at least one filter parameter has been changed.

16. The method of claim 14, further comprising generating a clock signal and providing said gain setting signal and said first filter parameter signal in synchronism with said clock signal.

17. The method of claim 14, further comprising generating the second filter parameter signal to re-establish said at least one filter parameter value when said gain setting signal indicates no change of the currently valid gain setting, and providing said second filter parameter signal in synchronism with said clock signal.

18. The method of claim 14, wherein said change of the at least one parameter value is maintained for a predefined time period.

19. The method of claim 14, wherein a clock signal is provided and said predefined time period corresponds to a predefined number of clock periods.

20. The method of claim 14, wherein said at least one parameter is a cut-off frequency of a high-pass filter.

21. The method of claim 14, wherein said at least one parameter is a Q-factor of a low-pass filter.

22. A method of controlling gain of a baseband signal in a direct-conversion receiver, the receiver comprising a baseband section having a gain controller, a variable gain section, a filter unit switchable between a first operation mode and at least one second operation mode, the method comprising:

assessing, by the gain controller, a baseband signal output by the filter unit;

supplying a gain setting signal from the gain controller to the variable gain section to select one of a plurality of discrete gain settings on the basis of said assessment; and supplying a first filter parameter signal from the gain controller to the filter unit, said filter parameter signal causing the filter unit to operate in one of the first and second operation mode depending on the said assessment; and generating a second filter parameter signal to re-establish said first operation mode when said gain setting signal indicates no change of the currently valid gain setting.

23. The method of claim 22, wherein assessing said baseband signal includes generating a sample signal indicative of a signal amplitude of said baseband signal, and selecting said gain setting on the basis of sample signal.

24. The method of claim 23, wherein a settling time of the filter unit in the second operation mode is less than a settling time in the first operation mode, and said first filter parameter signal causes the filter unit to operate in the second operation mode when the gain settling signal causes a change of the currently valid gain setting of the variable gain section.

25. The method of claim 22, further comprising generating a second filter parameter signal to re-establish the first operation mode.

26. The method of claim 22, further comprising generating a clock signal and providing said gain setting signal and said filter parameter signal in synchronism with said clock signal.

27. The method of claim 22, further comprising generating a second filter parameter signal to re-establish said first operation mode when said gain setting signal indicates no change of the currently valid gain setting, and providing said second filter parameter signal in synchronism with said clock signal.

28. The method of claim 22, wherein said second operation mode is maintained for a predefined time period.

29. The method of claim 22, wherein a clock signal is provided and said predefined time period corresponds to a predefined number of clock periods.

30. The method of claim 22, wherein the filter unit includes a high-pass filter and a low-pass filter, wherein a cut-off frequency of the high-pass filter is increased and a Q-factor of the low-pass filter is decreased to operate the filter unit in the second operation mode.

31. A method of automatically controlling gain of a baseband signal in a direct conversion receiver, the method comprising:

obtaining a sample signal from said baseband signal, the sample signal being indicative of a signal amplitude of the baseband signal;

generating a gain setting signal on the basis of said sample signal to select one of a plurality of discrete gain settings of the direct conversion receiver;

generating a first filter parameter signal in correlation with said gain setting signal, the filter setting signal causing a change of at least one filter parameter value when said gain setting signal indicates a change of the currently valid gain setting; and generating a second filter parameter signal to re-establish said at least one filter parameter value when said gain setting signal indicates no change of the currently valid gain setting, and providing said second filter parameter signal in synchronism with said clock signal.

32. A method of controlling gain of a baseband signal in a direct-conversion receiver, the receiver comprising a baseband section having a gain controller, a variable gain section, a filter unit switchable between a first operation mode and at least one second operation mode, the method comprising:

assessing, by the gain controller, a baseband signal output by the filter unit;

supplying a gain setting signal from the gain controller to the variable gain section to select one of a plurality of discrete gain settings on the basis of said assessment;

supplying a first filter parameter signal from the gain controller to the filter unit, said filter parameter signal causing the filter unit to operate in one of the first and second operation mode depending on the said assessment; and generating a second filter parameter signal to re-establish said first operation mode when said gain setting signal indicates no change of the currently valid gain setting, and providing said second filter parameter signal in synchronism with said clock signal.

33. An automatic gain controller for digitally controlling gain of a baseband signal comprising:

a baseband signal input section configured to receive the baseband signal and to provide a sample signal indicative of the baseband signal amplitude;

a gain control section configured to produce a gain setting signal in response to said sample signal; and a filter parameter section configured to produce a filter parameter signal for changing a filter parameter when said gain setting signal indicates a change of a currently valid gain setting, wherein said filter parameter is a Q-factor of a low-pass filter and wherein the baseband signal is a baseband signal of a direct conversion receiver.

34. A direct conversion receiver comprising:
a baseband section including
 at least one variable gain amplifier,
 a filter unit coupled with its input to an output of the variable gain amplifier and configured to reduce DC offset and to select a desired signal channel, the filter unit being operable in a first operation mode and a second operation mode by changing at least one filter parameter wherein said filter unit comprises a high pass filter coupled to the output of the variable gain amplifier to reduce DC offset and a low pass filter coupled to the output of said high pass filter to select the desired frequency range, wherein at least one filter parameter is the Q-factor of a low pass filter; and
an automatic gain controller configured to select a gain setting on the basis of a signal output by the baseband section and to switch the filter unit from the first operation mode into the second operation mode upon changing a gain setting of said variable gain amplifier.

* * * * *